United States Patent [19]

Suntola et al.

[11] 4,058,430

[45] Nov. 15, 1977

[54] METHOD FOR PRODUCING COMPOUND THIN FILMS

[76] Inventors: Tuomo Suntola, Riihikallio, 02610 Espoo 61, Finland; Jorma Antson, Urheilutie 22, 01350, Vantaa 35, Finland

[21] Appl. No.: 635,233

[22] Filed: Nov. 25, 1975

[30] Foreign Application Priority Data

Nov. 29, 1974 Finland .................................. 743473

[51] Int. Cl.$^2$ ........................ B05D 5/00; B05D 5/12
[52] U.S. Cl. ..................................... 156/611; 118/49; 156/612; 427/87; 427/248 B; 427/248 E; 427/248 J; 427/255
[58] Field of Search ............ 427/250, 399, 87, 248 B, 427/248 E, 248 J, 255; 156/600, 612, 611; 118/49

[56] References Cited

U.S. PATENT DOCUMENTS

| 3,489,621 | 1/1970 | Sirtl .................. 427/250 X |
| 3,493,430 | 2/1970 | Manasevit .......... 427/250 X |
| 3,556,837 | 1/1971 | Hammond ............ 427/250 |
| 3,576,670 | 4/1971 | Hammond ............ 427/250 X |
| 3,839,084 | 10/1974 | Cho et al. .............. 156/611 |
| 3,862,859 | 1/1975 | Ettenberg et al. ....... 156/600 X |
| 4,000,716 | 1/1977 | Kurata et al. ........... 427/87 X |

OTHER PUBLICATIONS

Curzon et al., J. Phys. D. Appl. Phys. vol. 5, No. 5 (1972), pp. 1046–1048.

*Primary Examiner*—Harry J. Gwinnell
*Attorney, Agent, or Firm*—Steinberg & Blake

[57] ABSTRACT

A method is provided for growing highly oriented compound thin films on a substrate by subjecting the substrate to the vapor of a first single element which can react with the surface at a temperature sufficiently high for the reaction to occur which forms a single atomic layer of the first single element on the surface and then subjecting the thus formed surface with a first single element atomic layer thereon to the vapor of a second single element which can react with the first single element at a temperature sufficiently high for the reaction to occur so that a single atomic layer of the second single element is formed on the surface bound to the first single element. This procedure can then be repeated alternately subjecting the surface to the vapors of the first single element then to the second single element, etc. until the compound film reaches a desired thickness. There is further provided an apparatus for carrying out this method comprising a vacuum chamber with evacuating means, a support for supporting a substrate, sources for at least two vapors of two different single elements and operating means for providing on the substrate first a single atomic layer of one of the elements, and then a single atomic layer of the other of the elements.

8 Claims, 7 Drawing Figures

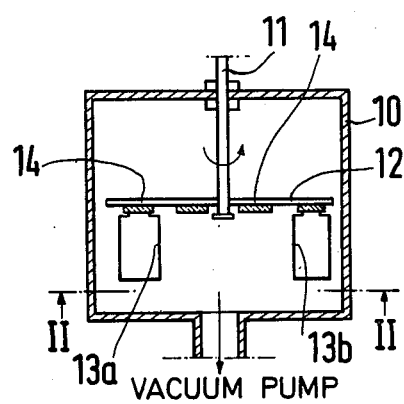
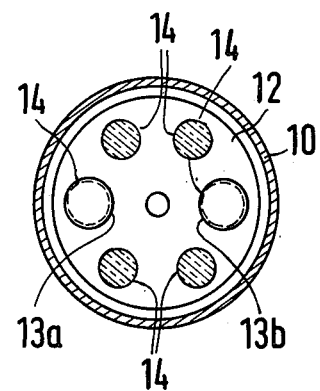
FIG. 1    FIG. 2
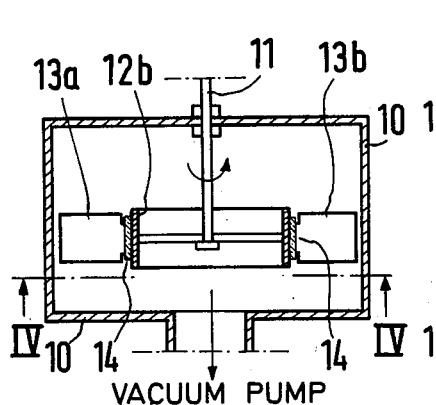
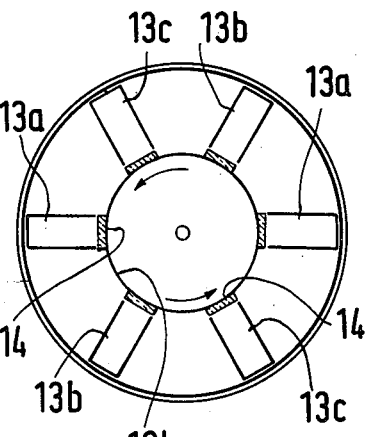
FIG. 3    FIG. 4

METHOD FOR PRODUCING COMPOUND THIN FILMS

BACKGROUND OF THE INVENTION

The present invention concerns the production of compound thin films by deposition from the gaseous phase, this invention relating to a method for producing such compound thin films and an apparatus for carrying out the method.

Among the methods for producing compound thin films from the gaseous phase, the most important method is vacuum evaporation. This effected either directly using the particular compound as the source of the vapors or by simultaneous evaporation of the different chemical element components from different sources and thus subjecting the substrate on which the compound thin film is to be formed simultaneously to the vapors of the elements. In other words the substrate is simultaneously subject to the vapors from the evaporation of the compound or from the simultaneous evaporation of the element forming the compound.

In the first case, the major drawback resides in the decomposition of the compound into its components which makes it extremely difficult, if not impossible, to control the stoichiometry of the film that is produced, the stoichiometry generally tending to change during the course of the evaporation process.

When the gases for the formation of the thin film are supplied by simultaneous evaporation of the component elements from which the compound is formed, good stoichiometry requires extremely close control of the evaporation rates of the different compounds, or selective back evaporation of the more readily evaporating component. As in the case of evaporation from the compound itself, the nucleation properties and crystal structure of the film are inadequately controllable in the case of subjecting the substrate to the vapors from simultaneous evaporation of the components thereof.

When a single crystal substrate is used in the manner known in the art, the selective back evaporation can be made sufficiently efficient so that the growing film continues the crystal structure of the substrate. This type of procedure is known as Molecular Beam Epitaxy and is described in J. Vac. Sci. Technol., Vol. 10, No. 5, Sept./Oct. 1973, L. L. Chang et al. "Structures Grown by Molecular Beam Epitaxy".

When the completed compound is used as a source, the decomposition of the compound can be reduced in manner known in the art by means of sputtering techniques wherein the material to be transposed is detached from the source by ion bombardment. The best stoichiometry is usually attained in sputtering techniques by means of so-called bias sputtering, which is comparable to the use of back evaporation.

SUMMARY OF THE INVENTION

Generally speaking, in accordance with the invention highly oriented compound thin films are produced with almost perfect stoichiometry by alternately subjecting the substrate, one at a time, to the vapor of each of the elements of which the compound is formed.

It is accordingly a primary object of the present invention to provide a method of producing compound thin films which results in the formation of a highly oriented compound and which does this while avoiding the disadvantages of the prior art.

It is another object of the present invention to provide a method of producing compound thin films according to which almost perfect stoichiometry is achieved.

It is yet a further object of the present invention to provide for the production of compound thin films by the building up of a single atomic layers of the elements of which the compound is formed.

It is still a further object of the present invention to provide apparatus for carrying out the method of the invention. Still further the present invention provides apparatus which can be used for the simultaneous production of many crystals in accordance with the method of the invention.

Other objects and advantages of the present invention will be apparent from a further reading of the specification and the appended claims.

With the above and other objects in view, the present invention mainly comprises in a method of growing highly oriented compound thin films on a substrate the subjecting of the substrate to the vapor of a first single element which can react with the surface of the substrate at a temperature sufficiently high for such reaction to occur whereby a single atomic layer of the first single element is formed on the surface, and subjecting the thus formed surface with he first single element atomic layer thereon to the vapor of a second single element which can react with the first single element at a temperature sufficiently high for such reaction to occur whereby a single atomic layer of the second single element is formed on the surface bound to the first single element. This procedure can be continued by alternately using the single elements of the compound to be formed until the formed compound reaches a desire to thickness.

The apparatus for carrying out the above method mainly comprises vacuum chamber means for providing an evacuated atmosphere, a pair of means situated in the vacuum chamber means, the pair of means including a support means for supporting at least one substrate and a source means for forming sources for as least two vapors of two different single elements, respectively, and operating means operatively connected with one of the pair of means for operating the one means with respect to the other of the pair of means for providing on the substrate first a single atomic layer of one of the elements and then a single atomic layer of the other of the elements.

For facility of discussion the process of the invention will often hereinafter be referred to as "atomic layer epitaxy", and will be abbreviated as "ALE".

The most important groups of compound films are the II–VI and III–V binary compounds in combinations thereof. This is mainly due to the semiconductor characteristics of these compounds. In order to achieve successful semiconductor uses of the compounds, the crystalline structure of the films is of primary importance. For most applications this requirement is sufficiently high to restrict the useful material to only single crystals which can be made by epitaxy on a single crystal substrate. The epitaxy of compound materials is relatively difficult, compared to the epitaxy of elementary materials such as silicon and germanium. This is mainly due to the higher complexity of the compound growth, which in the case of binary compounds and vapor phase epitaxy involves the existence of both the vapor and solid phases of the compound and both component elements. To obtain a good stoichiometry, it is therefore necessary to have precise control of the arrival rates or partial pressures of the component elements as well as of the temperature of the substrate.

For many applications it is desirable to have the semiconductor material in this film form on a substrate which is not a single crystal but which combines the features of low price and possible extensive areas of use. Such applications wherein II-VI and III-V compounds are of high interest are, for example, in solar cells, many optoelectronic devices, imaging devices, display devices, etc. Extensive use of the devices has, however, been limited by the poor quality of the semiconductor material obtained by deposition techniques of the prior art.

Every known deposition technique in the prior art used to obtain film deposition on non-single crystal substrates includes the unavoidable feature of formation of nuclei at the beginning of the film growth. The film does not achieve a continuous structure until the single microcrystals (growing nuclei) touch each other which generally occurs when the mean thickness of the film is of the order of 100 A. The resulting films have a polycrystalline structure and under certain circumstances an amorphous structure. The electrical characteristics of the films are greatly affected by the polycrystalline structure of the material. Not only do the electrical characteristics of the films suffer from the poor structure of the materials, but the chemical stability thereof also suffers, and of course this is a necessary condition for technical use of the films. Moreover, both the electrical and chemical characteristics of the compound films are strongly affected by deviations from stoichiometry, which deviations are most difficult to avoid in the known depositions processes.

As indicated above, the compound film generation method according to the invention is mainly characterized in that the solid phase surface (substrate) is reacted stepwise with vapors, one at a time, each consisting only of one of the elementary components of the compound, so that as a result of the surface reaction there is bound on the surface not more than one atomic layer of the element in question in each of the reaction steps. The apparatus is thus mainly characterized is that it comprises a vacuum chamber, a substrate holder placed therein, vapor sources, and means by which the substrate is subjected to the influence of the single different vapor sources, each in its turn.

The method of the present invention provides the important advantage of epitaxy even when an amorphous substrate is used and this method results in a nucleation-free compound film which is highly oriented in the direction of film growth. An essential difference from other deposition methods resides in the fact that film growth proceeds stepwise, atomic plane by atomic plane, resulting from a surface reaction between one component element in gas phase with the other as surface atoms in the growing compound film.

The process of the invention can be made self-balancing by maintaining the temperature of the growing surface at a temperature which is high enough to prevent condensation of the element in each individual reaction step. Thus, for a binary film AB, wherein A represents an element of groups I, II, III or IV, and B represents an element of groups VII, VI or V, the reaction is cyclically repeated, i.e. gas A reacts with a B surface forming an A surface with A-B compound bonding, then the surface is subjected to gas B wherein as a result of the reaction between gas B and the A surface B-A bonding is formed resulting in a B surface, which again is subjected to a A gas, etc.

When a glass substrate is used the condition for initiation of the stepwise process is that one of the components of the compound must have sufficient bonding strength with the oxygen atoms which form the surface of the glass. This condition is directly fulfilled for most II-VI and III-V compounds and it can, in practice, be fulfilled for all compounds suitable for ALE growth using intermediate atomic layers. If the ALE method of the present invention is used for epitaxy on single crystals, the lattice direction of the substrate must fulfill the condition of component atom planes in rotation.

BRIEF DESCRIPTION OF THE DRAWINGS

For a fuller understanding of the invention reference is had to the following description taken in connection with the accompanying drawings, in which:

FIG. 1 is a schematic partly sectional view of an apparatus for carrying out the method of the invention;

FIG. 2 is a transverse section of the structure of FIG. 1 taken along line II—II of FIG. 1 in the direction of the arrows;

FIG. 3 is a partly sectional schematic elevation of another embodiment of a structure of the invention for carrying out the method of the invention;

FIG. 4 is a transverse section of the structure of FIG. 3 taken along line IV—IV of FIG. 3 in the direction of the arrows.

The apparatus of FIG. 5 provides for the reaction chamber being tightly sealed against vacuum yet permits axial movement of the structure holder. The embodiment of FIG. 6 provides for the substrate being stationary, and FIG. 7 shows a modification of the embodiment of FIG. 6 and according to which the film growth takes place on both sides of the substrate and the reaction chamber can be evacuated between each reaction step by means of a special valve means.

DESCRIPTION OF PREFERRED EMBODIMENTS

Figure 5:
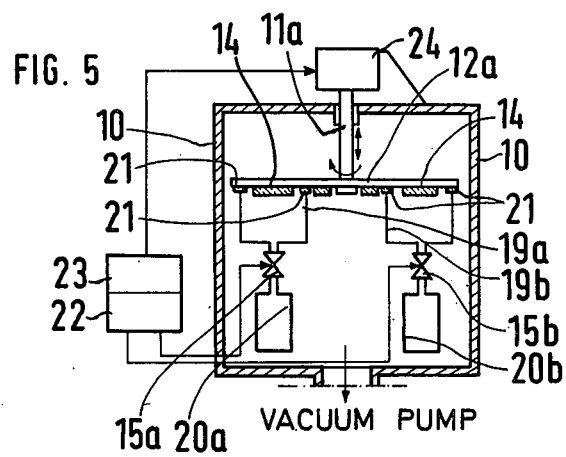
FIGS. 5-7 respectively illustrate schematically and partly in section three different further embodiments of structures according to the present invention for carrying out the method of the invention.

Referring now to FIGS. 1 and 2, there is illustrated a vacuum chamber means 10 wherein substrates 14, on which the film is to be grown, are mounted on a support means, disc 12 which is rotatable by means of rotating shaft 11. Vapor source means 13a and 13b are arranged below the disc 12, each of these vapor sources being isolated from the other and arranged to have a desired vapor pressure of the elementary component of the film to be grown on the substrates. Rotation of the disc 12 provides rotation of the substrates 14 which are alternately placed in interaction with the vapors of element A from vapor source means 13a and with the vapors of element B from vapor source means 13b, whereby the growth of the film takes places by single atomic layers of A-B-A-B, etc. in accordance with the process of the invention. Provision is made by means not shown for maintaining the desired temperature of substrate 14 as required by the process and for maintaining the gas pressures in the vapor source means 13a and 13b.

In the embodiment of FIGS. 3 and 4, the support means disc 12 is replaced by support means ring 12b which is rotatable by means of the shaft 11, the substrates 14 being mounted on the outer circumference of the ring 12b. The vapor source means 13a, 13b and 13c are placed radially around ring 12b so that upon rotation of ring 12b by means of shaft 11, each of the substrates 14 is alternately subjected to the action of the single element gas vapors in source means 13a, 13b, 13c, and again 13a, 13b, 13c, etc. The speed of rotation of ring 12a is most appropriately maintained at between 1 and 20 r.p.sec.

In the devices shown in FIGS. 1 to 4, a relative motion is provided between the substrates 14 and the vapor sources 13 by means of stationary vapor sources 13 and means for moving the substrates 14 into operative connection therewith. The same result may be accomplished by providing for stationary substrates 14 and means for moving the vapor sources 13 into operative connection with the substrates 14. Thus, for example, the apparatus may be designed so that the substrates 14 are fixed to a type of conveyor belt assembly which carries the substrates into operative connection with the vapor sources. It is thus apparent that the relative motion of the substrate and vapor sources with respect to each other may be accomplished in many different ways.

As shown in FIG. 5, a vacuum chamber means 10 is provided with separate reaction chambers 19a and 19b to which the substrates 14 can be alternately moved by rotation of the support means disc 12a which is effected by rotation of shaft 11a by a rotating means which is schematically shown by block 24. This arrangement permits excellent isolation of the reaction steps with smaller leakage of the reaction gases, although it is mechanically more complicated than the arrangements shown in FIGS. 1–4. Improved isolation of the reaction steps may also be obtained with fewer mechanically moving parts using the embodiments of FIGS. 6 and 7 which will be described below. In FIG. 5 the block 24 actually illustrates a means for carrying out both axial movement of the shaft 11a and rotating movement thereof. Block 23 schematically represents the control means for controlling the particular movement and block 22 schematically represents a control means for controlling the opening and closing of the valve means 15a and 15b for control of the gases from the respective source means 20a and 20b into the respective reaction chambers 19a and 19b which are sealed from the atmosphere in the vacuum chamber 10 by sealing means 21.

Figure 6:
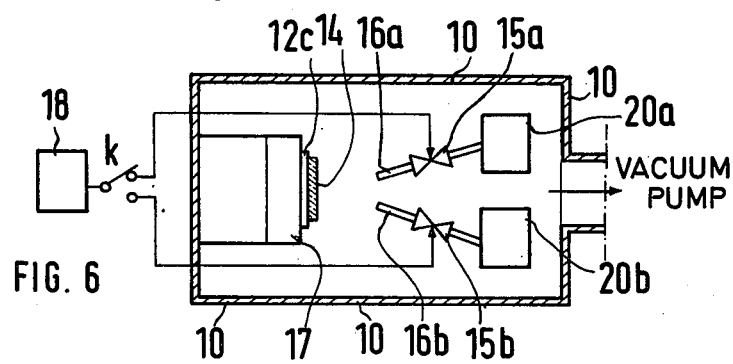

In the apparatus shown in FIG. 6, the substrate 14 is mounted on stationary support means 12c and is maintained at a suitable temperature by means of heating member 17. Two vapor sources 20a and 20b are provided for alternately subjecting the substrate 14 to the vapors from each of the vapor sources. This is accomplished by means of valves 15a and 15b provided respectively on pipes 16a and 16b, these valves alternately opening and closing so that while one of the valves 15a or 15b is open, the other valve is closed. The control of the operation of the valves is schematically represented by block 18 and switch k.

Figure 7:
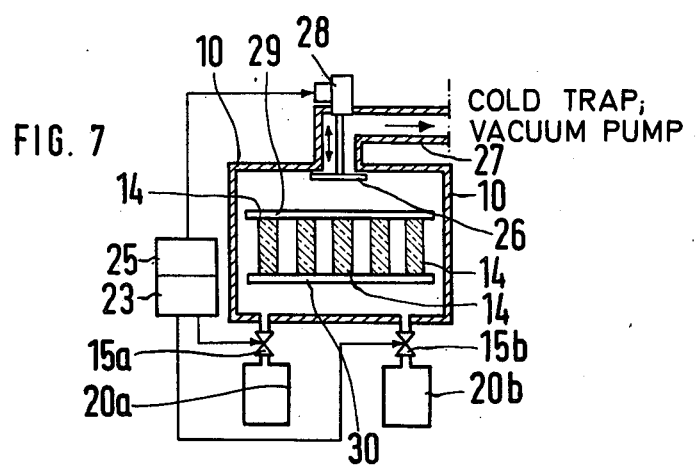

FIG. 7 shows a provision of the different vapor sources 20a and 20b outside of the reaction chamber 10. The substrates 14 in the vacuum chamber 10 are held in position by holding means 29 and 30 in such manner that both sides of each of the substrates 14 is subjected to the action of the particular vapor.

The reaction chamber 10 is alternately filled with the elementary gas from vapor sources 20a and 20b by alternate operation of valves 15a and 15b, the reaction chamber being evacuated between consecutive steps by action of a vacuum pump (not shown) which draws the gas out through conduit 27 upon actuation of valve 26, the actuation of which is controlled by an actuating device schematically shown by block 28. Block 25 schematically shows the control means for actuation of valve 26 by actuating device 28, and block 22 schematically shows the control means for controlling the opening and closing of valves 15a and 15b.

In the process of the invention, atomic layers are deposited of, for example element A and B, wherein element A generally belongs to one of the groups I, II, III or IV of the periodic system and element B belongs to one of the groups VII, VI or V, respectively of the periodic system. The most typical films produced by the method of the invention are I-VII, II-VI or III-V compounds or oxides. According to the invention element A in gaseous phase reacts with the surface on which the film is to be grown, the surface atoms of which belong to group B, forming a single atomic layer due to the powerful B-A bond produced on the surface. All of the A atoms impinging on the surface, in addition to those which form the B-A bond immediately return to the gaseous phase in the case where the A-A bond is not sufficiently strong to prevent the back evaporation of the element A which occurs as a result of the temperature which is above the evaporation temperature of element A. When in interaction with the gaseous phase of the element A, the film that is being grown can only grow by a single atomic layer even if the the number of atoms impinging on the surface considerably exceeds that which corresponds to the single or monoatomic layer.

After the surface to be grown has been in interaction with the gaseous phase of element A, it is next brought into interaction with the gaseous phase of element B. The A atoms on the surface layer of the film now enter into the formation of a strong B-A bond by the action of the B atoms directly thereon, and the surface thus becomes covered with a single atomic layer of element B. Again, the B-B bond is unable to prevent the element B from returning to the gaseous phase because it is not sufficiently strong to do so. These alternate reaction steps are repeated until the required thickness of the A-B compound is obtained.

While the invention is not meant to be limited to any specific theory as to how the process takes place, the following theoretical background is given to help to better understand the invention.

In the source 13a the element A is in equilibrium between its solid phase and its vapor pressure $p_A$ at temperature $T_a$ (or if $T_a$ exceeds the melting point of A, equilibrium prevails between the liquid and gaseous phases). The corresponding situation for element B obtains in the source 13b. In the case of a self-balancing ALE procedure the substrate temperature $T_o$ is kept higher than the source temperature $T_A$ and $T_B$, which means that the A and B vapors do not condense on the substrate. In case wherein the A atoms form a solid compound with oxygen, with binding energy high enough to prevent decomposition, the substrate will be covered by a monatomic layer of A atoms with A-O bonds. The coverage of the surface with A atoms can be described by the equation $$dP_A = \frac{\mu_A \alpha_{AO}}{N_s}(1 - P_A) \cdot dt \qquad (1)$$

-continued
$$P_A = 1 - e^{-\frac{\mu_A \alpha_{AO}}{N_s} \cdot t_{AO}}$$

wherein $P_A$ = relative surface area covered with A atoms $\mu_A$ = collision density of A atoms with the surface, which has the form (according to kinetic gas theory)

$$\mu_A = \frac{P_A}{\sqrt{2\,mkT}}\left[\frac{\text{atom}}{\text{cm}^2}\right] \approx \frac{10^{20}}{[\text{torr}]}\left[\frac{1}{\text{cm}^2 s}\right]$$

$N_S$ = density of surface atoms $N_s \approx 10^{15}\ 1/\text{cm}^2$ $t_{AO}$ = interaction time of the surface with O atom and reacting gas A [s]

$\alpha_{AO}$ = surface reaction probability, of atom A with O atom surface, corresponding to the "sticking coefficient" in conventional deposition methods.

The surface reaction probability $\alpha$ is a complex function of the temperature of the reaction surface and the pressure of the reaction gas. It varies widely with different elements and compounds formed. For monatomic gases $\alpha$ has been found to be higher than for biatomic or multiatomic gases.

From equation (1) it can be found that the relative coverage of the surface with A atoms approaches unity asymptotically with increasing time of interaction.

A significant benefit of the ALE growth is that the vapor pressure of the forming compound has its minimum exactly in the growth direction, the strongest possible bonds occurring perpendicular to the surface.

If the B atoms form a solid compound with oxygen with high binding energy, the substrate in interaction with the B source will be covered with B atoms exactly as described for the interaction between it and the A atoms and the glass surface. For B type elements this is not generally the case, which means that the surface of the substrate glass will remain unchanged during its interaction with B vapor.

In the next reaction step the substrates covered with a monatomic layer of A atoms are placed in interaction with the source of B atoms in gas phase. The surface will be covered with B atoms according to equation (1), again forming a monatomic layer of B atoms with A-B compound bond. The conditions valid for the vapor pressures of said monoatomic B layer with A-B bonds and B atoms on this layer, with B-B bonds, differ by many orders of magnitude, resulting in an extremely selective back evaporation of the B atoms lacking compound bonds.

By repeated alternating reaction steps, the surface of the substrates will be covered by a layer structure O-A-B-A-B-A-B-A-B... where the first O stands for the surface atom layer of the substrate and the following A-B layers form a highly oriented film of compound AB. In the case of perfect coverage in each reaction step the total thickness of the film is determined by the number of alternate reaction steps and the lattice constant of the compound.

Using several sources with different elements $A_1...A_n$, $B_1...B_m$, layer structures containing compound combinations, such as superlattices, heterojunctions, etc., may be grown.

The conditions for ALE growth, as described, may be defined by the terms of equation (1). For a full coverage as described above the conditions $$\alpha_{AO}\mu_A T_{AO} >> N_s$$

$$\alpha_{AB}\mu_A t_{AB} >> N_s$$

and $$\alpha_{BA}\mu_B t_{BA} >> N_s \qquad (2)$$

must be provided.

In cases with $p_A$ and $p_B$ directly in interaction with the reacting surface, as in FIGS. 1,2,3,4,5 and 7, the source temperatures $T_A$ and $T_B$ are linked with $\mu_A$ and $\mu_B$ by equations $$\mu_A = f(p_A) = f(T_A)$$

$$\mu_B = f(p_B) = f(T_B) \qquad (3)$$

To ensure perfect back evaporation of the elements having no compound bond, which is mandatory in a self-balancing ALE process, the substrate temperature $T_o$ must be sufficiently far above the temperatures $T_A$ and $T_B$ to provide for the self balancing conditions. The upper limit of $T_o$ is in principle determined by the vapor pressure of the compound.

In practice, however, when a glass substrate is used, the upper limit of $T_o$ is generally determined by the softening point of the substrate glass. It should be noted that the lattice direction of the growing surface in ALE growth most efficiently minimizes the vapor pressure of the compound. This has been established e.g. in connection with CdSe growth, which has been carried out at $T_o > 500°$ C withot any detectable back evaporation of the compound.

It is obvious that ALE growth is obtainable with several types of growing equipment. The essential features are the source and substrate temperatures, and stepwise interactions between the substrate and the element vapors of the compound in rotation. The II–VI compound group particulaly offers great freedom in equipment design, due to the high vapor pressure of II and VI elements. Two principal arrangements different from that described in FIG. 5 have been shown and described in FIGS. 6 and 7.

In ALE growth the interaction with a component vapor may also be obtained by using a gaseous compound of the element which decomposes on the reacting surface, in analogy with the practice of chemical vapor deposition. This kind of reaction may be accomplished e.g. with $H_2S$, instead of $S_2$. The corresponding surface reactions in the case of ZnS growth are $$H_2S(g) + Zn(s) \rightarrow ZnS(s) + H_2(g)$$

in the case of $H_2S$, corresponding to the reaction $$S_2(g) + 2\,Zn(s) \rightarrow 2\,ZnS(s)$$

for pure $S_2$ gas. According to the ALE principle the reactions are only possible as long as free Zn(s) surface atoms are available. The ALE procedure can be performed with the aid of sputter-type deposition of the component elements. In this case there is an inert gas or plasma present in the reaction steps.

When applying equation (1) to surfaces which are not perfectly covered with the atoms causing surface reaction with the gas atoms in question, the equation is not only applied to the active portion of the surface. If an AB compound is grown using partial surface coverage in each or one of the process steps, the equation (1) may be modified to read $$P_A = P_B^* - e^{-\frac{\mu_A \alpha_{AB}}{N_s} \cdot t_{ab}} \quad (4)$$

for A atom reation steps and $$P_B = P_A^* - e^{-\frac{\mu_B \alpha_{BA}}{N_s} \cdot t_{BA}} \quad (5)$$

for B atom reaction steps, whre $P^*_B$ and $P^*_A$ represent the relative converages of B and A atoms on the surface before the A and B reaction steps, respectively.

The partial coverage of one component element is of particular importance when growing compound films from low vapor pressure elements or in the case of compounds whhich contain different amounts of the component elements. An important example of the first mentioned case is the growth of III-V compounds on a substrate which cannot be heated to a temperature $T_o$ high enough to ensure perfect back evaporation of the group III element. In such case the surface reaction between group V surface atoms and group III gaseous atoms is limited to cause only partial coverage of group III atoms in order to assure the absence of supernumerary group III atoms on the surface. The group V gas reaction with the surface partially covered with group III atoms can be made perfect enough to assure the oriented nucleation-free ALE growth of the compound.

Another important case in which partial surface reaction steps must be used is the growth of dioxides of elements which also have stable or relatively stable monoxides. The growth of tin dioxide by ALE technique is illustrative. In order to form $SnO_2$, instead of SnO, the interaction of Sn vapor with the O surface is restricted to cause Sn coverage of only a few percent. The $O_2$ interaction, effected by means of $O_2$ plasma, ensures the maximum number of oxygen atoms which can be bonded with the Sn atoms, thus causing the growth of the dioxide. A strong indication for use of ALE growth in such instances has also emerged from the observation that the $SnO_2$ layer on a glass plate shows electrical conductivity in the plane of the surface starting from 10 A of $SnO_2$ thickness. The conductivity shows no tunnelling effects, which is proof that the film has a continuous crystal structure. Such films are physically extremely firm and chemically resistant, which is in fact true of all compound films made by the ALE technique of the present invention, no matter whether complete or partial coverage of the reaction surface is obtained in the individual reaction steps.

The following Examples are given to further illustrate the present invention, the scope of the invention is not, however, being limited by these Examples.

EXAMPLE 1

ALE growth for ZnS was carried out with the equipment of FIGS. 1 and 2 with following values of system parameters:

Speed of rotation 2 r/s — substrate material: Corning Glass 7059 — substrate temperature 320° C, the total bombardment of Zn-atoms during one interaction between the surface and Zn vapor about $5 \times 10^{15}$ atoms/cm², which was measured with a quarzcrystal rate monitor, corresponding to an effective Zn vapor pressure of about $10^{-3}$ torr and equilibrium temperature of about 290 C for the Zn source — equilibrium temperature of the S source 100° C, corresponding to a vapor pressure of about $10^{-2}$ torr and total bombardment of $S_2$ molecules of about $5 \times 10^{16}$ molecules/cm².

For a 10 minutes process the film thickness was about 0.27 μm, for processes of 20 and 30 minutes the thicknesses were about 0.54 μm and 0.80 μm respectively.

The film structure was examined by etching techniques.

EXAMPLE 2

Ale growth of $SnO_2$ layers on Corning Glass 7059 substrates was carried out using the equipment of FIGS. 1 and 2 as follows:
The substrate temperature 300° C
The total amount of Sn atoms during one interaction with Sn source about $0.6 \times 10^{14}$ atoms/cm²
oxygen source is of plasma type with 10–100 mTorr total pressure and 40mA plasma current. The total bombardment of $O_2^-$ions being $\sim 7 \times 10^{14}$ ions/cm² during the interaction with the plasma source
with speed rotation 1 r/s this process gives a growth of $SnO_2$ film to 600A in 25 minutes giving 0.4A average growth rate during each rotation

EXAMPLE 3

ALE growth of GaP-layers on Corning Glass 7059 substrates was carried out using the equipment of FIGS. 1 and 2 as follows:
the substrate temperature $\sim$ 300° C
the total amount of Ga atoms during the interaction with Ga source $10^{15}$ atoms/cm²
the total amount of P molecules (most probably $P_4$) bombarding the surface during the interaction with Phosphorus oven is about $5 \times 10^{15}$ atoms/cm²
a 0.25 μ film was grown with these parameters of substrate and sources in 25 minutes with rotation speed 1 r/s. Average growth rate was 1.7A during each cycle.

EXAMPLE 4

ALE growth of ZnS was carried out using the equipment of FIG. 7 with following system parameters:
substrate c.g. 7059
substrate temperature $\sim$ 470° C
temperature of Zn-source $\sim$ 390° C
temperature of S-source $\sim$ 120° C
interaction time of the Zn-source 6 seconds
escape time of the Zn-vapor 2 seconds
interaction time of the S-source 2 seconds
escape time of the $S_2$-vapor 6 seconds
The growth occurred at maximum speed within the accuracy of thickness measurement thus corresponding to full coverage at each reaction step. With a 140 min process the film thickness was 0.12 μm.

Experiments with the self-balancing ALE growth have established the fact that the theoretical growth speed cannot be exceeded but is approached asymptotically with increased time (or pressure) of interaction of each reaction step.

Selective etching of the ZnS films made by ALE techniques were performed with the aid of an etchant containing 60 parts $H_3PO_4$, 5 parts $HNO_3$ and 1 part HF at room temperature. The etching speed was from 10 μm/s to 150 μ/s in the direction of the surface for 0.1 to 0.7 μm thick ZnS films while no etching effect could be detected in the direction perpendicularly to the surface plane. Etching of ALE-SnO$_2$ films was possible only by electrochemical methods.

While the invention has been illustrated in particular with respect to specific devices and methods of carrying out the same, it is apparent that variations and modifications thereof can be made.

Of course it will be understood that in order to clearly illustrate the invention many details of the structure which are of no particular interest have been omitted. Thus it will be well understood that the substrates are removably mounted on the support means by any suitable mounting structures, and in the same way suitable supporting frameworks are provided for supporting the various sources. Moreover, in connection with the embodiment of FIGS. 4 and 5 it will be noted that there are three sources 13a, 13b, and 13c, so that with such an arrangement it is possible to subject each substrate in succession to three vapors of three single elements, respectively. Thus, the invention is not necessarily limited to only two single elements. For example, a third element may be introduced in this manner by the use of a third vapor source, the third element being in the case of semi-conductor films introduced as a dopant. The dopant element, in fact, can be added from different sources.

What is claimed is:

1. Method of forming and growing a highly oriented thin film of a compound by reaction of the single elements of said compound on a substrate, which comprises subjecting said substrate to the vapor of a first single element which can react with the surface of said substrate at a temperature sufficiently high for such reaction to occur and too high for vapors of said first single element to condense on the surface which is formed, whereby a single atomic layer of said first single element is formed on said surface, subjecting the thus formed surface of said first single element atomic layer to the vapor of a second single element which can react with said first single element at a temperature sufficiently high for such reaction to occur and too high for vapors of said second single element to condense on the surface which is formed, whereby a single atomic layer of said second element is formed on said surface bound to said first single element, and alternately subjecting the thus formed surface under the same conditions to vapors of single elements each of which can react with the surface single element until the formed compound film reaches a desired thickness.

2. Method according to claim 1 wherein the compound film is formed only of said first and second single elements.

3. Method according to claim 1 wherein the substrate is amorphous.

4. Method according to claim 1 wherein the substrate is polycrystalline.

5. Method according to claim 1 wherein the substrate is a substrate is a single crystal.

6. Method according to claim 1 wherein the number of atoms of one of said single elements to which the surface is subjected is less than the number sufficient to fully cover said surface with a single atomic layer while maintaining the temperature of the surface during the subjecting of the same to said single element at below the temperature which prevents condensation of said single element onto the surface of the same single element, whereby despite said temperature only a single atomic layer of said one single element is formed.

7. Method according to claim 1 wherein the compound film to be formed consists of at least two atoms of one of said single elements for each atom of the other of said single elements, wherein the surface is subjected to less than the number of atoms of said other single elements sufficient to fully cover the surface with an atomic layer of said other single element, and then subjecting the thus formed surface to the action of a sufficient number of said one of said single elements to react with said other of said single elements to form the compound consisting of at least two of said one of said single elements for each of said other of said single elements.

8. Method according to claim 1 wherein the compound film is formed of at least three different single elements.

* * * * *